(12) United States Patent
Terasaki et al.

(10) Patent No.: US 10,283,431 B2
(45) Date of Patent: May 7, 2019

(54) BONDED BODY, POWER MODULE SUBSTRATE WITH HEAT SINK, HEAT SINK, METHOD OF MANUFACTURING BONDED BODY, METHOD OF MANUFACTURING POWER MODULE SUBSTRATE WITH HEAT SINK, AND METHOD OF MANUFACTURING HEAT SINK

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/504,763

(22) PCT Filed: Aug. 24, 2015

(86) PCT No.: PCT/JP2015/073720
§ 371 (c)(1),
(2) Date: Feb. 17, 2017

(87) PCT Pub. No.: WO2016/031770
PCT Pub. Date: Mar. 3, 2016

(65) Prior Publication Data
US 2017/0271237 A1    Sep. 21, 2017

(30) Foreign Application Priority Data

Aug. 26, 2014  (JP) .................................. 2014-171901
Aug. 18, 2015  (JP) .................................. 2015-161293

(51) Int. Cl.
*H01L 23/373*     (2006.01)
*H01L 21/48*     (2006.01)
(Continued)

(52) U.S. Cl.
CPC ...... *H01L 23/3735* (2013.01); *H01L 21/4882* (2013.01); *H01L 23/3736* (2013.01);
(Continued)

(58) Field of Classification Search
CPC ...................... H01L 23/3735; H01L 21/4882
(Continued)

(56) References Cited

U.S. PATENT DOCUMENTS

2012/0008655 A1   1/2012  Niwa
2013/0292816 A1*  11/2013 Otaki ...................... B32B 15/01
                                                257/706

(Continued)

FOREIGN PATENT DOCUMENTS

CN     102651348 A    8/2012
CN     103958113 A    7/2014
(Continued)

OTHER PUBLICATIONS

International Search Report dated Nov. 2, 2015, issued for PCT/JP2015/073720 and English translation thereof.
(Continued)

*Primary Examiner* — Cuong Q Nguyen
*Assistant Examiner* — Tong-Ho Kim
(74) *Attorney, Agent, or Firm* — Locke Lord LLP; James E. Armstrong, IV; Nicholas J. DiCeglie, Jr.

(57) ABSTRACT

The present invention is a bonded body in which an aluminum member constituted by an aluminum alloy, and a metal member constituted by copper, nickel, or silver are bonded to each other. The aluminum member is constituted by an aluminum alloy in which a Si concentration is set to be in a range of 1 mass % to 25 mass %. A Ti layer is formed at a bonding portion between the aluminum member and the metal member, and the aluminum member and the Ti layer, (Continued)

and the Ti layer and the metal member are respectively subjected to solid-phase diffusion bonding.

10 Claims, 8 Drawing Sheets

(51) Int. Cl.
*H01L 25/07* (2006.01)
*H01L 25/18* (2006.01)
*H01L 23/473* (2006.01)

(52) U.S. Cl.
CPC ............ *H01L 25/07* (2013.01); *H01L 25/18* (2013.01); *H01L 23/473* (2013.01); *H01L 2224/32225* (2013.01)

(58) Field of Classification Search
USPC ........................................................ 257/707
See application file for complete search history.

(56) References Cited

U.S. PATENT DOCUMENTS

| | | | | |
|---|---|---|---|---|
| 2014/0367454 | A1* | 12/2014 | Fujita | B23K 20/04 228/158 |
| 2015/0041188 | A1* | 2/2015 | Terasaki | B23K 20/023 174/252 |

FOREIGN PATENT DOCUMENTS

| | | |
|---|---|---|
| JP | 3012835 B2 | 2/2000 |
| JP | 2000-183253 A | 6/2000 |
| JP | 3171234 B2 | 5/2001 |
| JP | 2004-172378 A | 6/2004 |
| JP | 2007-067258 A | 3/2007 |
| JP | 2008-208442 A | 9/2008 |
| JP | 2010-098057 A | 4/2010 |
| JP | 2010-258420 A | 11/2010 |
| JP | 2012-104539 A | 5/2012 |
| JP | 2012-160641 A | 8/2012 |
| JP | 2013235936 A | 11/2013 |
| JP | 2014-056934 A | 3/2014 |
| JP | 2014-177031 A | 9/2014 |
| JP | 2014-179463 A | 9/2014 |
| WO | 2013/065160 A1 | 5/2013 |
| WO | 2014/061588 A1 | 4/2014 |

OTHER PUBLICATIONS

Extended European Search Report issued in corresponding European Patent Application No. EP 15836211.1, dated Mar. 15, 2018.
Office Action (part of a Search Report) issued in corresponding Chinese Patent Application No. CN 201580035553.3, dated Jul. 3, 2018.
Notice of Allowance issued in corresponding Japanese Patent Application No. JP 2015-161293, dated Oct. 9, 2018.

* cited by examiner

BONDED BODY, POWER MODULE SUBSTRATE WITH HEAT SINK, HEAT SINK, METHOD OF MANUFACTURING BONDED BODY, METHOD OF MANUFACTURING POWER MODULE SUBSTRATE WITH HEAT SINK, AND METHOD OF MANUFACTURING HEAT SINK

CROSS REFERENCE TO RELATED APPLICATIONS

This application is related to co-pending application: "BONDED BODY, POWER MODULE SUBSTRATE WITH HEAT SINK, HEAT SINK, METHOD OF MANUFACTURING BONDED BODY, METHOD OF MANUFACTURING POWER MODULE SUBSTRATE WITH HEAT SINK, AND METHOD OF MANUFACTURING HEAT SINK" filed even date herewith in the names of Nobuyuki TERASAKI and Yoshiyuki NAGATOMO as a national phase entry of PCT/JP2015/073680, which application is assigned to the assignee of the present application and is incorporated by reference herein.

TECHNICAL FIELD

The invention relates to a bonded body in which an aluminum member and a metal member constituted by copper, nickel, or silver are bonded to each other, a power module substrate with heat sink in which a heat sink is bonded to a power module substrate in which a circuit layer is formed on one surface of an insulating layer, a heat sink in which a metal member layer is formed in a heat sink main body, a method of manufacturing the bonded body, a method of manufacturing the power module substrate with heat sink, and a method of manufacturing the heat sink.

Priority is claimed on Japanese Patent Application No. 2014-171901, filed on Aug. 26, 2014, and Japanese Patent Application No. 2015-161293, filed on Aug. 18, 2015, the contents of which are incorporated herein by reference.

BACKGROUND ART

A semiconductor device such as an LED and a power module is provided with a structure in which a semiconductor element is bonded to a circuit layer formed from a conductive material.

In a large-power control power semiconductor element that is used to control wind power generation, an electric vehicle, a hybrid vehicle, and the like, the amount of heat generation is great. According to this, as a substrate on which the power semiconductor element is mounted, for example, a power module substrate including a ceramic substrate formed from aluminum nitride (AlN), alumina ($Al_2O_3$), and the like, and a circuit layer formed by bonding a metal plate with excellent conductivity on one surface of the ceramic substrate has been widely used in the related art. Furthermore, as the power module substrate, a power module substrate, in which a metal layer is formed on the other surface of the ceramic substrate, is also provided.

For example, a power module disclosed in Patent Document 1 includes a power module substrate in which a circuit layer and a metal layer which are constituted by Al are respectively formed on one surface and the other surface of a ceramic substrate, and a semiconductor element that is bonded onto the circuit layer through a solder material.

In addition, a heat sink is bonded to a lower side of the power module substrate to radiate heat, which is transferred from the semiconductor element to the power module substrate side, to an outer side through the heat sink.

However, as is the case with the power module described in Patent Document 1, in a case where the circuit layer and the metal layer are constituted by Al, an oxide film of Al is formed on a surface, and thus it is difficult to bond the semiconductor element or the heat sink onto the surface with the solder material.

Accordingly, for example, as disclosed in Patent Document 2, after a Ni plating film is formed on the surface of the circuit layer and the metal layer through electroless plating and the like, the semiconductor element or the heat sink is soldered.

Patent Document 3 suggests a technology of bonding the circuit layer and the semiconductor element, and bonding the metal layer and the heat sink, by using silver oxide paste, which contains silver oxide particles and a reducing agent composed of an organic, as an alternative of the solder material.

However, as described in Patent Document 2, in the power module substrate in which the Ni plating film is formed on the surface of circuit layer and the surface of the metal layer, during bonding of the semiconductor element and the heat sink, a surface of the Ni plating film deteriorates due to oxidation and the like, and thus there is a concern that bonding reliability of the semiconductor element and the heat sink which are bonded through the solder material deteriorates. In addition, in a Ni plating process, a masking process may be performed in order for a trouble such as electrolytic corrosion due to formation of the Ni plating in an unnecessary region not to occur. As described above, in a case of performing a plating process after performing the masking process, a great deal of labor is necessary in the step of forming the Ni plating film on the surface of the circuit layer and the surface of the metal layer, and thus there is a problem that the manufacturing cost of the power module greatly increases.

As described in Patent Document 3, in a case of bonding the circuit layer and the semiconductor element, and the metal layer and the heat sink, respectively, by using the silver oxide paste, bondability between Al and a sintered body of the silver oxide paste is poor, and thus it is necessary to form a Ag underlying layer on the surface of the circuit layer and the surface of the metal layer in advance.

Accordingly, Patent Document 4 suggests a power module in which the circuit layer and the metal layer are set to have a laminated structure of an Al layer and a Cu layer. In this case, the Cu layer is disposed on the surface of the circuit layer and the metal layer, it is possible to bond the semiconductor element and the heat sink by using the solder material in a satisfactory manner. In addition, deformation resistance of Cu is greater in comparison to Al. Accordingly, when a heat cycle is applied to the power module, it is possible to suppress great deformation of the surface of the circuit layer and the surface of the metal layer. As a result, occurrence of a crack in a solder layer is prevented, and thus it is possible to improve bonding reliability between the semiconductor element and the circuit layer, and the heat sink and the metal layer.

In the power module described in Patent Document 4, a bonded body, in which the Al layer and the Cu layer are bonded through a Ti layer, is used as the circuit layer and the metal layer. Here, a diffusion layer is formed between the Al layer and the Ti layer, and this diffusion layer includes an Al—Ti layer, an Al—Ti—Si layer, and an Al—Ti—Cu layer in this order from an Al layer side.

CITATION LIST

Patent Literature

[Patent Document 1] Japanese Patent Publication No. 3171234
[Patent Document 2] Japanese Unexamined Patent Application, First Publication No. 2004-172378
[Patent Document 3] Japanese Unexamined Patent Application, First Publication No. 2008-208442
[Patent Document 4] Japanese Patent Publication No. 3012835

DISCLOSURE OF INVENTION

Technical Problem

In the power module described in Patent Document 4, the Al—Ti layer and the Al—Ti—Cu layer, which are hard and brittle intermetallic compound layers, are formed at a bonding interface between the Al layer and the Ti layer in the circuit layer and the metal layer. Therefore, there is a problem that the intermetallic compound layers become the origin of a crack when the heat cycle and the like are applied.

Further, in a case where a Cu plate and the like are laminated on the Al layer through Ti foil, and the resultant laminated body is heated to a temperature at which an interface between the Al layer and the Ti foil is melted, a liquid phase is generated at the bonding interface. In this case, there is a problem that a bump occurs or the thickness varies, and thus bonding reliability deteriorates.

Here, as described in Patent Document 4, it can be considered to form a Ni layer by bonding a Ni plate on the surface of the circuit layer and the metal layer, which are constituted by Al, through a Ti foil as an alternative of the Ni plating in Patent Document 2. In addition, when using the silver oxide paste disclosed in Patent Document 3, it can be considered to form the Ag underlying layer by bonding a Ag plate onto the surface of the circuit layer and the metal layer, which are constituted by Al, through Ti foil.

However, in the method described in Patent Document 4, when forming the Ni layer or the Ag layer, a hard and brittle intermetallic compound layer such as an Al—Ti layer, an Al—Ti—Ni layer, and an Al—Ti—Ag layer may be formed at the bonding interface between the Al layer and the Ti layer similar to the case where the Cu layer is formed, or a bump occurs at the bonding interface. As a result, there is a concern that the bonding reliability may deteriorate.

As described above, in the related art, it is difficult to bond an aluminum member and a metal member that is constituted by any one of copper, nickel, and silver in a satisfactory manner, and thus it is difficult to obtain a bonded body with excellent bonding reliability.

In addition, in a heat sink having a complicated structure in which a flow passage of a cooling medium and the like are formed on an inner side, the heat sink may be manufactured by using a casted aluminum alloy that contain a relatively great amount of Si. In this heat sink, as described in Patent Document 4, in a case of bonding the heat sink to the metal member that is constituted by copper, nickel, or silver, it is difficult to sufficiently raise a bonding temperature, and thus it is difficult to bond Ti and Cu.

The invention has been made in consideration of the above-described situation, and an object thereof is to provide a bonded body in which an aluminum member constituted by an aluminum alloy containing a relatively great amount of Si, and a metal member constituted by copper, nickel, or silver are bonded to each other in a satisfactory manner, a power module substrate with heat sink and a heat sink which include the bonded body, a method of manufacturing the bonded body, a method of manufacturing the power module substrate with heat sink, and a method of manufacturing the heat sink.

Solution to Problem

To solve the above-described problem, according to an aspect of the invention, there is provided a bonded body in which an aluminum member constituted by an aluminum alloy, and a metal member constituted by copper, nickel, or silver are bonded to each other. The aluminum member is constituted by an aluminum alloy in which a Si concentration is set to be in a range of 1 mass % to 25 mass %. A Ti layer is formed at a bonding portion between the aluminum member and the metal member, and the aluminum member and the Ti layer, and the Ti layer and the metal member are respectively subjected to solid-phase diffusion bonding.

In the invention, the metal member is constituted by copper, a copper alloy, nickel, a nickel alloy, silver, or a silver alloy.

According to the bonded body configured as described above, the Ti layer is formed at the bonding portion between the aluminum member constituted by an aluminum alloy in which a Si concentration is set to be in a range of 1 mass % to 25 mass %, and the metal member. In addition, the metal member and the Ti layer, and the Ti layer and the aluminum member are respectively subjected to solid-phase diffusion bonding. Accordingly, it is possible to suppress mutual diffusion of Al atoms of the aluminum member and metal (Cu, Ni, and Ag) atoms of the metal member due to the Ti layer. In addition, it is possible to suppress formation of a hard and brittle intermetallic compound layer in a large thickness due to occurrence of a liquid phase at the bonding portion between the aluminum member and the metal member. Accordingly, it is possible to obtain a bonded body with satisfactory bonding reliability.

According to another aspect of the invention, there is provided a power module substrate with heat sink. The power module substrate with heat sink includes an insulating layer, a circuit layer that is formed on one surface of the insulating layer, a metal layer that is formed on the other surface of the insulating layer, and a heat sink that is bonded to the metal layer. In the metal layer, a bonding surface with the heat sink is constituted by copper, nickel, or silver. The heat sink is constituted by an aluminum alloy in which a Si concentration is set to be in a range of 1 mass % to 25 mass %. A Ti layer is formed at a bonding portion between the metal layer and the heat sink, and the metal layer and the Ti layer, and the Ti layer and the heat sink are respectively subjected to solid-phase diffusion bonding.

According to the power module substrate with heat sink configured as described above, the Ti layer is formed at the bonding portion between the metal layer of which the bonding surface with the heat sink is constituted by copper, nickel, or silver, and the heat sink. In addition, the metal layer and the Ti layer, and the Ti layer and the heat sink are respectively subjected to solid-phase diffusion bonding. Accordingly, it is possible to suppress mutual diffusion of Al atoms of the heat sink and metal (Cu, Ni, and Ag) atoms of the metal layer (bonding surface with the heat sink) due to the Ti layer. In addition, it is possible to suppress formation of a hard and brittle intermetallic compound layer in a large thickness due to occurrence of a liquid phase at the bonding portion between the heat sink and the metal layer. Accordingly, it is possible to improve bonding reliability between the heat sink and the power module substrate.

In addition, in the power module substrate with heat sink according to the aspect of the invention, the heat sink is constituted by an aluminum alloy in which a Si concentration is set to be in a range of 1 mass % to 25 mass %. According to this, it is possible to construct a heat sink having a complicated structure provided with a flow passage and the like, and thus it is possible to improve the heat radiation properties of the heat sink.

According to still another aspect of the invention, there is provided a heat sink including a heat sink main body, and a metal member layer that is bonded to the heat sink main body. The metal member layer is constituted by copper, nickel, or silver. The heat sink main body is constituted by an aluminum alloy in which a Si concentration is set to be in a range of 1 mass % to 25 mass %. A Ti layer is formed at a bonding portion between the heat sink main body and the metal member layer, and the heat sink main body and the Ti layer, and the Ti layer and the metal member layer are respectively subjected to solid-phase diffusion bonding.

According to the heat sink configured as described above, since the heat sink main body is constituted by the aluminum alloy in which the Si concentration is set to be in a range of 1 mass % to 25 mass %, it is possible to construct a heat sink main body with a complicated structure provided with a flow passage and the like. In addition, since the metal member layer, which is constituted by copper, nickel, or silver, is formed in the heat sink main body, it is possible to bond the heat sink and another member through soldering and the like in a satisfactory manner. In addition, in a case where the metal member layer is formed from a metal having thermal conductivity higher than that of the aluminum alloy, it is possible to spread heat in a plane direction in the metal member layer, and thus it is possible to greatly improve the heat radiation properties.

In addition, the Ti layer is formed at the bonding portion between the heat sink main body and the metal member layer, and the metal member layer and the Ti layer, and the Ti layer and the heat sink main body are respectively subjected to solid-phase diffusion bonding. According to this, it is possible to suppress mutual diffusion of Al atoms of the heat sink main body, and metal (Cu, Ni, and Ag) atoms of the metal member layer due to the Ti layer. In addition, it is possible to suppress formation of a hard and brittle intermetallic compound layer in a large thickness due to occurrence of a liquid phase at the bonding portion between the heat sink main body and the metal member layer.

Accordingly, it is possible to obtain a heat sink having satisfactory bonding reliability between the heat sink main body and the metal member layer.

According to still another aspect of the invention, there is provided a method of manufacturing the above-described bonded body. The method includes a Ti/metal member bonding step of subjecting a Ti material that becomes the Ti layer and the metal member to solid-phase diffusion bonding, and an aluminum member/Ti bonding step of subjecting a metal member to which the Ti material is bonded, and the aluminum member to solid-phase diffusion bonding.

According to the method of manufacturing the bonded body configured as described above, since after subjecting the Ti material that becomes the Ti layer and the metal member to the solid-phase diffusion bonding in the Ti/metal member bonding step, the metal member to which the Ti material is bonded, and the aluminum member are subjected to the solid-phase diffusion bonding, it is possible to set bonding conditions (temperature, time) between the Ti material and the metal member in a relatively free manner. In addition, it is possible to reliably subject the Ti layer and the metal member layer to the solid-phase diffusion bonding. In addition, in the aluminum member/Ti bonding step, it is possible to subject the Ti layer and the aluminum member to the solid-phase diffusion bonding under a low-temperature condition in which the aluminum member is not melted.

According to still another aspect of the invention, there is provided a method of manufacturing the above-described power module substrate with heat sink. The method includes a Ti/metal layer bonding step of subjecting a Ti material that becomes the Ti layer and the metal layer to solid-phase diffusion bonding, and a heat sink/Ti bonding step of subjecting a metal layer to which the Ti material is bonded, and the heat sink, to solid-phase diffusion bonding.

According to the power module substrate with heat sink configured as described above, since after subjecting the Ti material that becomes the Ti layer, and the metal layer to the solid-phase diffusion bonding in the Ti/metal layer bonding step, the metal layer to which the Ti material is bonded, and the heat sink are subjected to the solid-phase diffusion bonding, it is possible to set bonding conditions (temperature, time) between the Ti material and the metal layer in a relatively free manner. In addition, it is possible to reliably subject the Ti layer and the metal layer to the solid-phase diffusion bonding. In addition, in the heat sink/Ti bonding step, it is possible to subject the Ti layer and the heat sink to the solid-phase diffusion bonding under low-temperature conditions in which the heat sink is not melted.

According to still another aspect of the invention, there is provided a method of manufacturing the above-described heat sink. The method includes a Ti/metal member layer bonding step of subjecting a Ti material that becomes the Ti layer and the metal member layer to solid-phase diffusion bonding, and a heat sink main body/Ti bonding step of subjecting the metal member layer to which the Ti material is bonded, and the heat sink main body, to solid-phase diffusion bonding.

According to the method of manufacturing the heat sink configured as described above, since after subjecting the Ti material that becomes the Ti layer, and the metal member layer to the solid-phase diffusion bonding in the Ti/metal member layer bonding step, the metal member layer to which the Ti material is bonded, and the heat sink main body are subjected to the solid-phase diffusion bonding, it is possible to set bonding conditions (temperature, time) between the Ti material and the metal member layer in a relatively free manner. In addition, it is possible to reliably subject the Ti layer and the metal member layer to the solid-phase diffusion bonding. In addition, in the heat sink main body/Ti bonding step, the Ti layer and the heat sink main body are subjected to the solid-phase diffusion bonding under a low-temperature condition in which the heat sink main body is not melted.

Advantageous Effects of Invention

According to the invention, it is possible to provide a bonded body in which an aluminum member constituted by an aluminum alloy containing a relatively great amount of Si, and a metal member constituted by copper, nickel, or silver are bonded to each other in a satisfactory manner, a power module substrate with heat sink and a heat sink including the bonded body, a method of manufacturing the bonded body, a method of manufacturing the power module substrate with heat sink, and a method of manufacturing the heat sink.

BEST MODE FOR CARRYING OUT THE INVENTION (First Embodiment)

Hereinafter, description will be given of embodiments of the invention with reference to the accompanying drawings.

Figure 1:
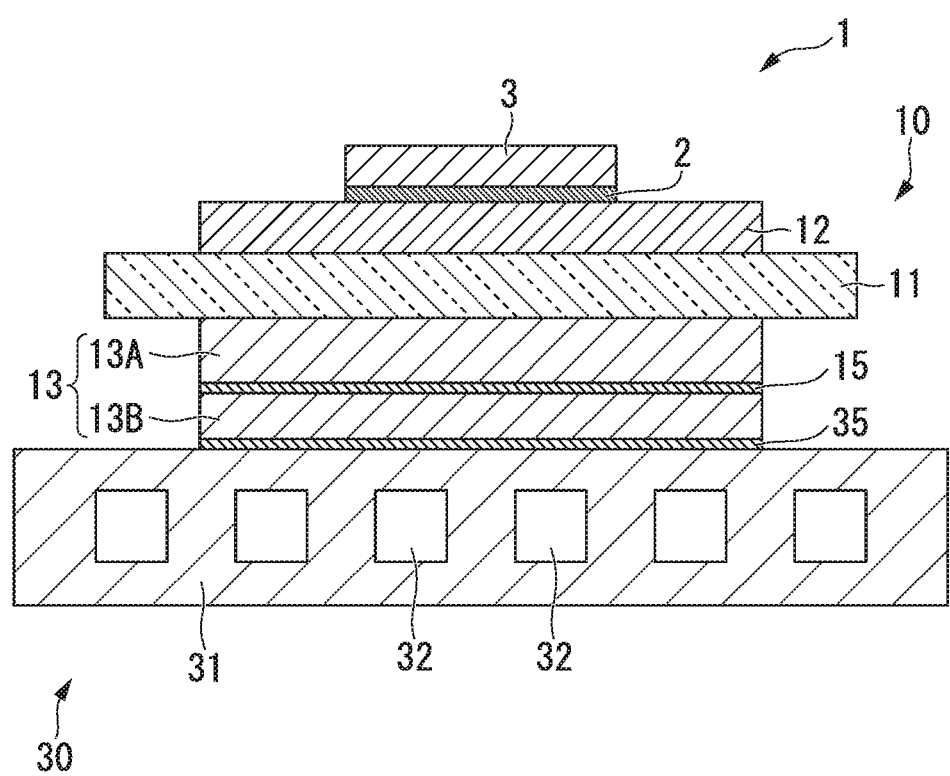
FIG. 1 is a view schematically showing a power module including a power module substrate with heat sink according to a first embodiment of the invention.

FIG. 1 shows a power module 1 using a power module substrate with heat sink 30 according to a first embodiment of the invention.

The power module 1 includes a power module substrate with heat sink 30, and a semiconductor element 3 that is bonded to one surface (an upper surface in FIG. 1) of the power module substrate with heat sink 30 through a solder layer 2.

The power module substrate with heat sink 30 includes a power module substrate 10, and a heat sink 31 that is bonded to the power module substrate 10.

The power module substrate 10 includes a ceramic substrate 11 that constitutes an insulating layer, a circuit layer 12 that is arranged on one surface (an upper surface in FIG. 1) of the ceramic substrate 11, and a metal layer 13 that is arranged on the other surface of the ceramic substrate 11.

The ceramic substrate 11 is configured to prevent electrical connection between the circuit layer 12 and the metal layer 13. For example, the ceramic substrate 11 is constituted by ceramics such as aluminum nitride (AlN), silicon nitride ($Si_3N_4$), and alumina ($Al_2O_3$) with high insulating properties, and is constituted by aluminum nitride (AlN) with high insulating properties in this embodiment. In addition, the thickness of the ceramic substrate 11 is set to be in a range of 0.2 mm to 1.5 mm, and is set to 0.635 mm in this embodiment.

Figure 5:
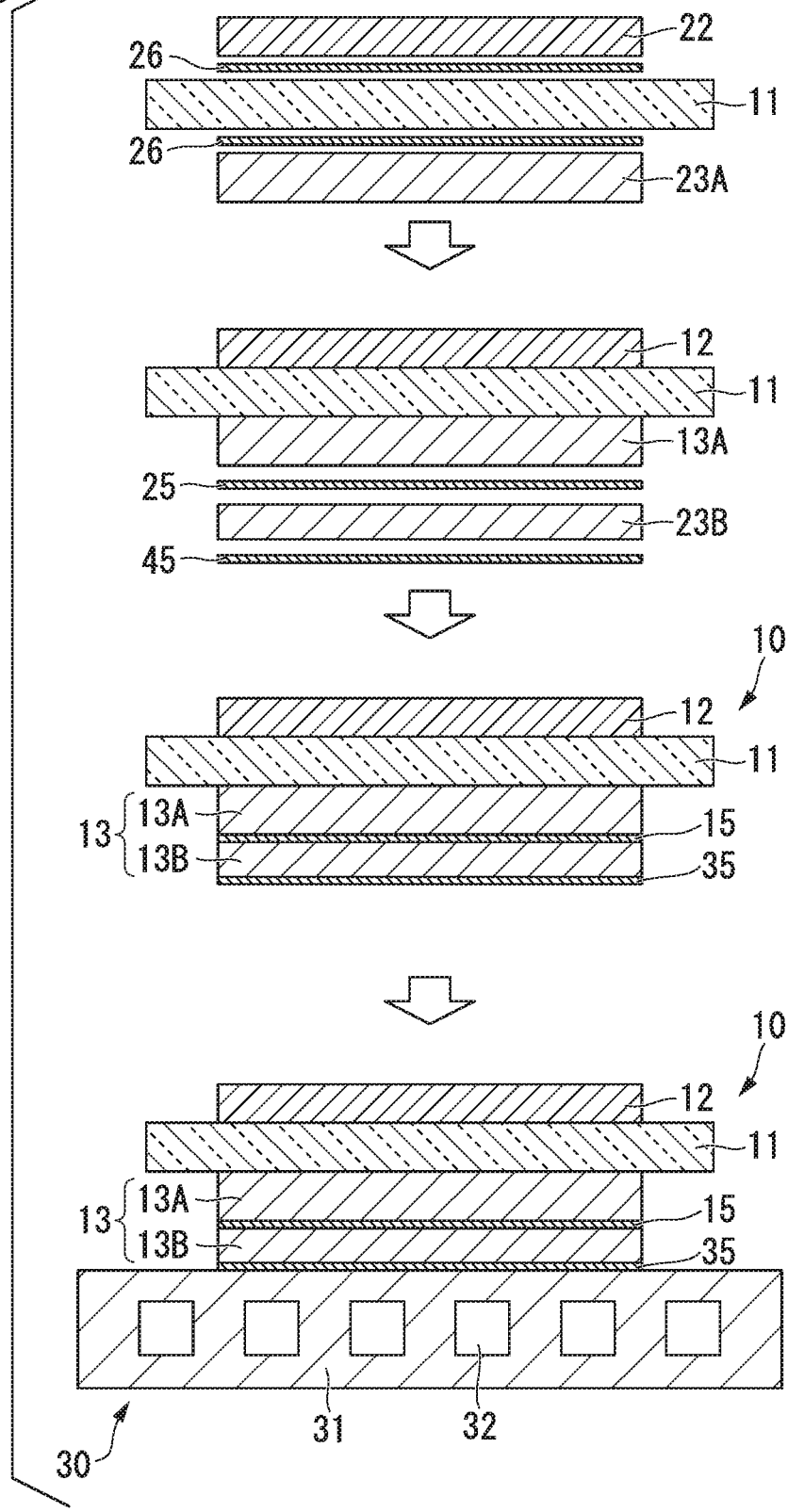
FIG. 5 is a view schematically showing a method of manufacturing a power module substrate according to the first embodiment.

As shown in FIG. 5, the circuit layer 12 is formed by bonding an aluminum plate 22, which is constituted by aluminum or an aluminum alloy, onto one surface of the ceramic substrate 11. In this embodiment, the circuit layer 12 is formed by bonding a rolled plate (aluminum plate 22) of aluminum (2N aluminum) having the purity of 99 mass % or greater to the ceramic substrate 11. The thickness of the aluminum plate 22, which becomes the circuit layer 12, is set to be in a range of 0.1 mm to 1.0 mm, and is set to 0.6 mm in this embodiment.

As shown in FIG. 1, the metal layer 13 includes an Al layer 13A that is arranged on the other surface of the ceramic substrate 11, and a Cu layer 13B that is laminated on a surface, which is opposite to a surface to which the ceramic substrate 11 is bonded, of the Al layer 13A through a first Ti layer 15.

As shown in FIG. 5, the Al layer 13A is formed by bonding an aluminum plate 23A, which is constituted by aluminum or an aluminum alloy, onto the other surface of the ceramic substrate 11. The thickness of the aluminum plate 23A, which is bonded, is set to be in a range of 0.1 mm to 1.0 mm, and is set to 0.6 mm in this embodiment.

The Cu layer 13B is formed by bonding a copper plate 23B, which is constituted by copper or a copper alloy, onto the other surface of the Al layer 13A, through the first Ti layer 15. The thickness of the copper plate 23B is preferably set to be in a range of 0.05 mm to 1 mm, but there is no limitation thereto. In this embodiment, the copper plate 23B, which is bonded, is constituted by oxygen-free copper, and the thickness thereof is set to 0.8 mm.

The heat sink 31 is configured to radiate heat on a power module substrate 10 side. In this embodiment, as shown in FIG. 1, the heat sink 31 is provided with a flow passage 32 through which a cooling medium flows.

The heat sink 31 is constituted by an aluminum alloy in which a Si concentration is set to be in a range of 1 mass % to 25 mass %. Specifically, the heat sink 31 is constituted by ADC12 that is a die-casting aluminum alloy defined in JIS H 2118:2006. ADC12 is an aluminum alloy that contains Cu in a range of 1.5 to 3.5 mass %, and Si in a range of 9.6 to 12.0 mass %. It is preferable that the Si concentration of the aluminum alloy that constitutes the heat sink 31 is set to a range of 1 mass % to 13 mass %, and more preferably a range of 4 mass % to 13 mass %. However, there is no limitation to the range.

In addition, a second Ti layer 35 is formed at a bonding portion between the heat sink 31 and the metal layer 13 (Cu layer 13B), and the metal layer 13 (Cu layer 13B) and the second Ti layer 35, and the second Ti layer 35 and the heat sink 31 are subjected to solid-phase diffusion bonding, respectively.

Figure 2:
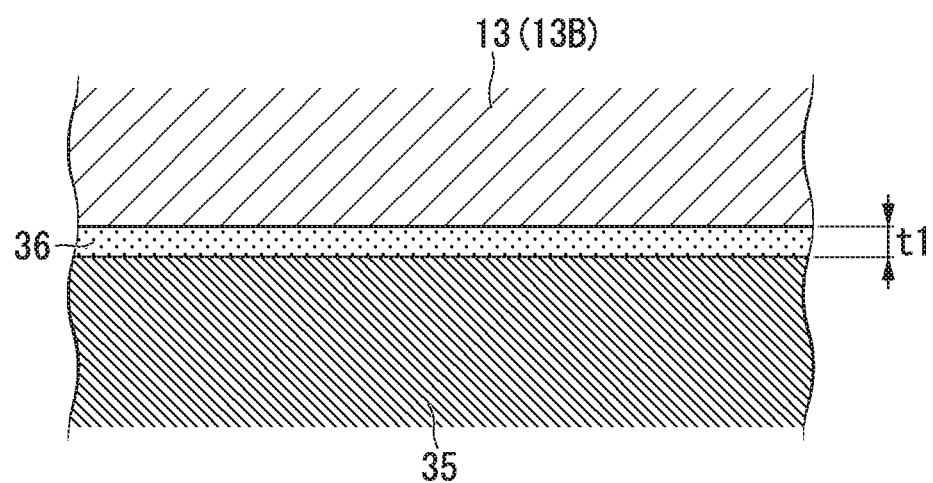
FIG. 2 is an enlarged view showing a bonding interface between a Cu layer of a metal layer and a second Ti layer in FIG. 1.

As shown in FIG. 2, a Cu—Ti layer 36 is formed at a bonding interface between the metal layer 13 (Cu layer 13B) and the second Ti layer 35. In this embodiment, the thickness t1 of the Cu—Ti layer 36 is set to be in a range of $1\ \mu m \leq t1 \leq 8$ $\mu m$. The thickness t1 of the Cu—Ti layer 36 is preferably set to be in a range of $2\ \mu m \leq t1 \leq 6.5\ \mu m$, but there is no limitation to the range.

Figure 3:
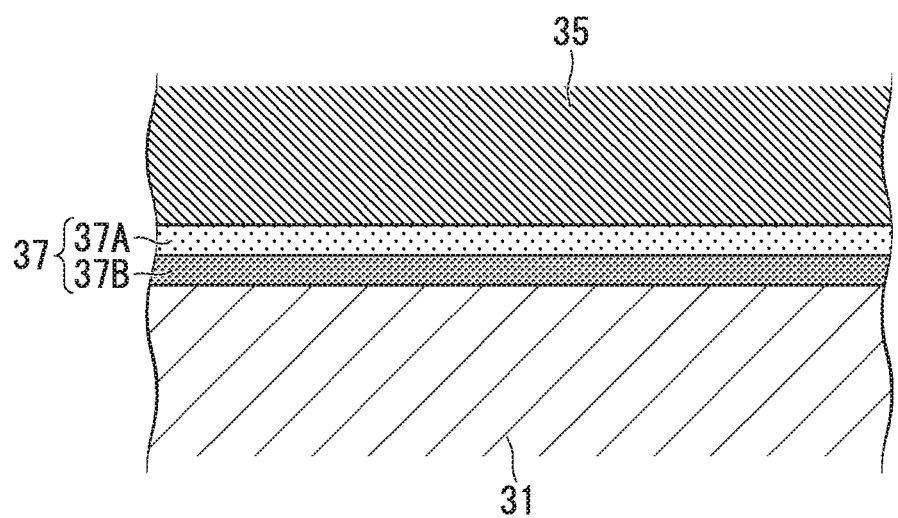
FIG. 3 is an enlarged view showing a bonding interface between a heat sink and the second Ti layer in FIG. 1.

In addition, in this embodiment, as shown in FIG. 3, an Al—Ti—Si layer 37 in which Si is solid-soluted in $Al_3Ti$ is formed at a bonding interface between the heat sink 31 and the second Ti layer 35. The Al—Ti—Si layer 37 includes a first Al—Ti—Si layer 37A that is formed on a second Ti layer 35 side, and a second Al—Ti—Si layer 37B that is formed on a heat sink 31 side.

The first Al—Ti—Si layer 37A and the second Al—Ti—Si layer 37B are constituted by an Al—Ti—Si phase in which Si is solid-soluted in $Al_3Ti$, and a Si concentration of the second Al—Ti—Si layer 37B is set to be lower than a Si concentration of the first Al—Ti—Si layer 37A. The Si concentration of the first Al—Ti—Si layer 37A is set to 10 at % to 30 at %, and the Si concentration of the second Al—Ti—Si layer 37B is set to be equal to or greater than 0.6 at % and less than 10 at %. It is preferable that the Si concentration of the first Al—Ti—Si layer 37A is set to 15 at % to 25 at %, and the Si concentration of the second Al—Ti—Si layer 37B is set to 2 at % to 5 at %. However, there is no limitation to the ranges.

Figure 4:
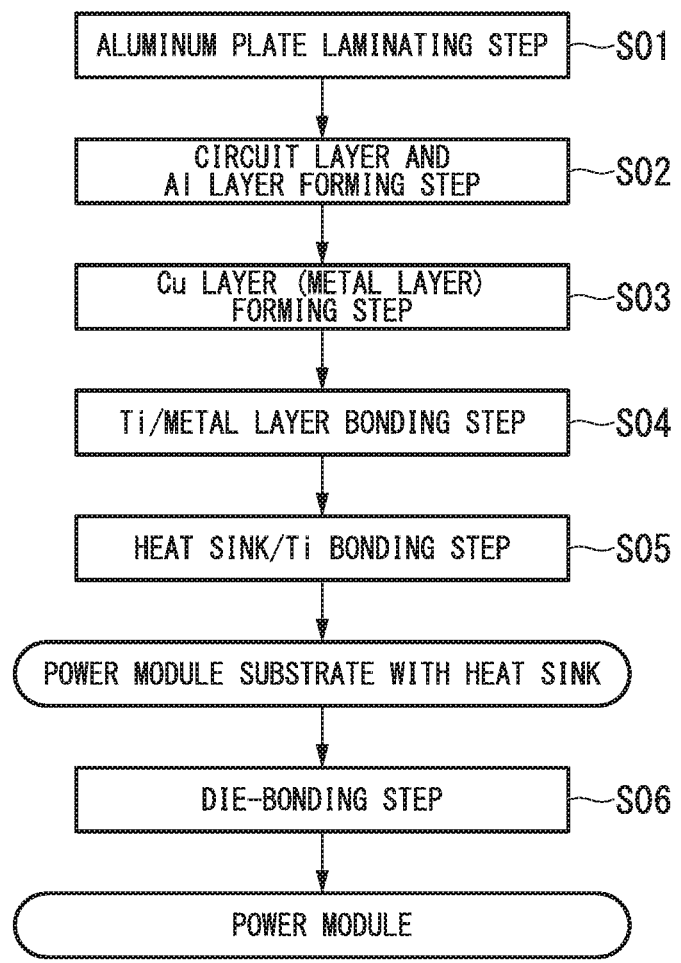
FIG. 4 is a flowchart showing a method of manufacturing the power module substrate with heat sink according to the first embodiment.

Next, description will be given of a method of manufacturing the power module substrate with heat sink 30 according to this embodiment with reference to FIG. 4 and FIG. 5.

(Aluminum Plate Laminating Step S01)

First, as shown in FIG. 5, the aluminum plate 22, which becomes the circuit layer 12, is laminated on one surface of the ceramic substrate 11 through Al—Si-based brazing material foil 26.

In addition, the aluminum plate 23A, which becomes the Al layer 13A, is laminated on the other surface of the ceramic substrate 11 through the Al—Si-based brazing material foil 26. Furthermore, in this embodiment, as the Al—Si-based brazing material foil 26, Al-6 mass % Si alloy foil having a thickness of 15 µm is used.

(Circuit Layer and Al Layer Forming Step S02)

The resultant laminated body is put in a vacuum heating furnace and is heated therein in a pressurized state (pressure is set to 1 to 35 kgf/cm$^2$ (0.10 to 3.43 MPa)) in a laminating direction to bond the aluminum plate 22 and the ceramic substrate 11, thereby forming the circuit layer 12. In addition, the ceramic substrate 11 and the aluminum plate 23A are bonded to form the Al layer 13A.

Here, it is preferable that a pressure inside the vacuum heating furnace is set to be in a range of $10^{-6}$ Pa to $10^{-3}$ Pa, a heating temperature is set to 600° C. to 643° C., and retention time is set to be in a range of 30 minutes to 180 minutes.

(Cu layer (Metal Layer) Forming Step S03, and Ti/Metal Layer Bonding Step S04)

Next, the copper plate 23B, which becomes the Cu layer 13B, is laminated on the other surface side of the Al layer 13A through first titanium foil 25. In addition, in this embodiment, second titanium foil 45 is laminated on the other surface side of the copper plate 23B. Here, the purity of the first titanium foil 25 and the second titanium foil 45 is set to 99 mass % or greater. In addition, the thickness of the first titanium foil 25 and the second titanium foil 45 is set to 3 µm to 40 µm, and is set to 10 µm in this embodiment.

The resultant laminated body is put in the vacuum heating furnace and is heated therein in a pressurized state (pressure is set to 1 to 35 kgf/cm$^2$ (0.10 to 3.43 MPa)) in the laminating direction to subject the Al layer 13A and the first titanium foil 25, and the first titanium foil 25 and the copper plate 23B to the solid-phase diffusion bonding, thereby forming the metal layer 13 that is constituted by a bonded body. In addition, the copper plate 23B (Cu layer 13B) and the second titanium foil 45 are subjected to the solid-phase diffusion bonding to form the second Ti layer 35.

Here, it is preferable that a pressure inside the vacuum heating furnace is set to be in a range of $10^{-6}$ Pa to $10^{-3}$ Pa, a heating temperature is set to be 600° C. to 643° C., and retention time is set to be in a range of 30 minutes to 180 minutes. It is preferable that the heating temperature is set to 630° C. to 643° C., and the retention time is set to be in a range of 45 minutes to 120 minutes, but there is no limitation to the ranges.

In respective bonding surfaces, which are subjected to the solid-phase diffusion bonding, of the Al layer 13A, the first titanium foil 25, the copper plate 23B, and the second titanium foil 45, scratches on the bonding surfaces are removed in advance, and thus the bonding surfaces are made to be smooth.

(Heat Sink/Ti Bonding Step S05)

Subsequently, the second Ti layer 35 and the heat sink 31 are laminated, and the resultant laminated body is put in a vacuum heating furnace and is heated therein in a pressurized state (pressure is set to 1 to 35 kgf/cm$^2$ (0.10 to 3.43 MPa)) in a laminating direction to subject the second Ti layer 35 and the heat sink 31 to the solid-phase diffusion bonding. In respective bonding surfaces, which are subjected to the solid-phase diffusion bonding, of the second Ti layer 35 and the heat sink 31, scratches on the bonding surfaces are removed in advance, and thus the bonding surfaces are made to be smooth.

Here, it is preferable that a pressure inside the vacuum heating furnace is set to be in a range of $10^{-6}$ Pa to $10^{-3}$ Pa, a heating temperature is set to 400° C. to 520° C., and retention time is set to be in a range of 3 hours to 48 hours. Furthermore, it is more preferable that the heating temperature is set to 480° C. to 520° C., and the retention time is set to be in a range of 18 hours to 24 hours, but there is no limitation to the ranges.

In this manner, the power module substrate with heat sink 30 of this embodiment is manufactured.

(Die-Bonding Step S06)

Subsequently, the semiconductor element 3 is laminated on one surface (front surface) of the circuit layer 12 through a solder material that becomes the solder layer 2, and the resultant laminated body is subjected to soldering in a reducing furnace.

In this manner, the power module 1 of this embodiment is manufactured.

According to the power module substrate with heat sink 30 configured as described above according to this embodiment, the metal layer 13 includes the Al layer 13A and the Cu layer 13B, the Cu layer 13B is set as a bonding surface with the heat sink 31, the second Ti layer 35 is formed at a bonding portion between the metal layer 13 (Cu layer 13B) and the heat sink 31, the metal layer 13 (Cu layer 13B) and the second Ti layer 35, the second Ti layer 35 and the heat sink 31 are respectively subjected to the solid-phase diffusion bonding. Accordingly, it is possible to suppress mutual diffusion of Al in the heat sink 31 and Cu in the Cu layer 13B due to the second Ti layer 35, and it is possible to suppress formation of a hard and brittle intermetallic compound layer in a large thickness at the bonding portion. As a result, when a heat cycle is applied, it is possible to suppress occurrence of a crack at the bonding portion, and thus it is possible to improve bonding reliability between the heat sink 31 and the power module substrate 10.

In this embodiment, the heat sink 31 is constituted by an aluminum alloy in which a Si concentration is set to be in a range of 1 mass % to 25 mass %. Specifically, the heat sink 31 is constituted by ADC12 (Si concentration is 9.6 to 12.0 mass %) that is a die-casting aluminum alloy defined in JIS H 2118:2006. According to this, it is possible to construct the heat sink 31 with a complicated structure provided with the flow passage 32, and thus it is possible to improve heat radiation performance.

In this embodiment, after subjecting the metal layer 13 (Cu layer 13B), and the second titanium foil 45 that becomes the second Ti layer 35 to the solid-phase diffusion bonding, the heat sink 31 and the second Ti layer 35 are subjected to the solid-phase diffusion bonding. Accordingly, it is possible to set solid-phase diffusion bonding conditions (temperature, time) between the metal layer 13 (Cu layer 13B) and the second Ti layer 35 in a relatively free manner, and thus it is possible to reliably subject the metal layer 13 (Cu layer 13B) and the second Ti layer 35 to the solid-phase diffusion bonding. In this embodiment, the Cu—Ti layer 36 of which the thickness t1 is set to be in a range of 1 μm≤t1≤8 μm is formed at the bonding interface between the metal layer 13 (Cu layer 13B) and the second Ti layer 35, and thus the metal layer 13 (Cu layer 13B) and the second Ti layer 35 are reliably bonded to each other.

The heat sink 31 and the second Ti layer 35 can be subjected to the solid-phase diffusion bonding under a low-temperature condition, and thus it is possible to suppress melting of the heat sink 31.

This embodiment has a configuration in which the Cu layer (metal layer) forming step S03 and the Ti/metal layer bonding step S04 are simultaneously performed, and thus it is possible to simplify a manufacturing step, and thus it is possible to reduce the manufacturing cost.

In this embodiment, the Al—Ti—Si layer 37 is formed at the bonding portion between the heat sink 31 and the metal layer 13 (Cu layer 13B), and the Si concentration of the first Al—Ti—Si layer 37A that is formed on the second Ti layer 35 side is higher than the Si concentration of the second Al—Ti—Si layer 37B that is formed on the heat sink 31 side. According to this, diffusion of Ti atoms to the heat sink 31 side is suppressed due to the first Al—Ti—Si layer 37A in which the Si concentration is high, and thus it is possible to make the thickness of the Al—Ti—Si layer 37 small.

The concentration of Si contained in the second Al—Ti—Si layer 37B, which is formed on the heat sink 31 side, is set to be equal to or greater than 0.6 at % and less than 10 at %. According to this, excessive diffusion of Al atoms to the second Ti layer 35 side is suppressed, and thus it is possible to make the thickness of the second Al—Ti—Si layer 37B small. In addition, the concentration of Si contained in the first Al—Ti—Si layer 37A, which is formed on the second Ti layer 35 side, is set to 10 at % to 30 at %. According to this, excessive diffusion of Ti atoms to the heat sink 31 side is suppressed, and thus it is possible to make the thickness of the first Al—Ti—Si layer 37A small.

In addition, in a case where scratches exist on bonding surfaces during the solid-phase diffusion bonding, a gap may occur during the solid-phase diffusion bonding. However, in this embodiment, after removing scratches on bonding surfaces to make the bonding surfaces smooth, the Al layer 13A, the first titanium foil 25, the copper plate 23B, the second titanium foil 45, and the heat sink 31 are subjected to the solid-phase diffusion bonding, and thus occurrence of a gap at respective bonding interface is suppressed, and thus reliable bonding is possible.

(Second Embodiment)

Figure 6:
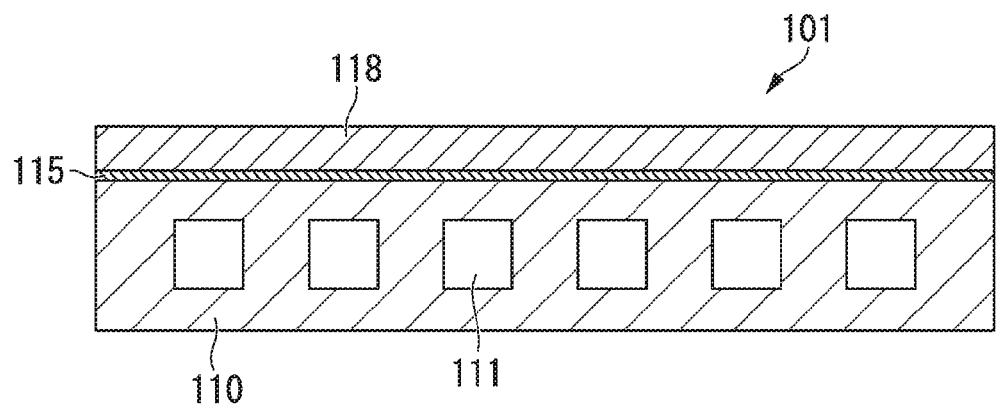
FIG. 6 is a view schematically showing a heat sink according to a second embodiment of the invention.

Next, description will be given of a heat sink according to a second embodiment of the invention. FIG. 6 shows a heat sink 101 according to the second embodiment of the invention.

Figure 10:
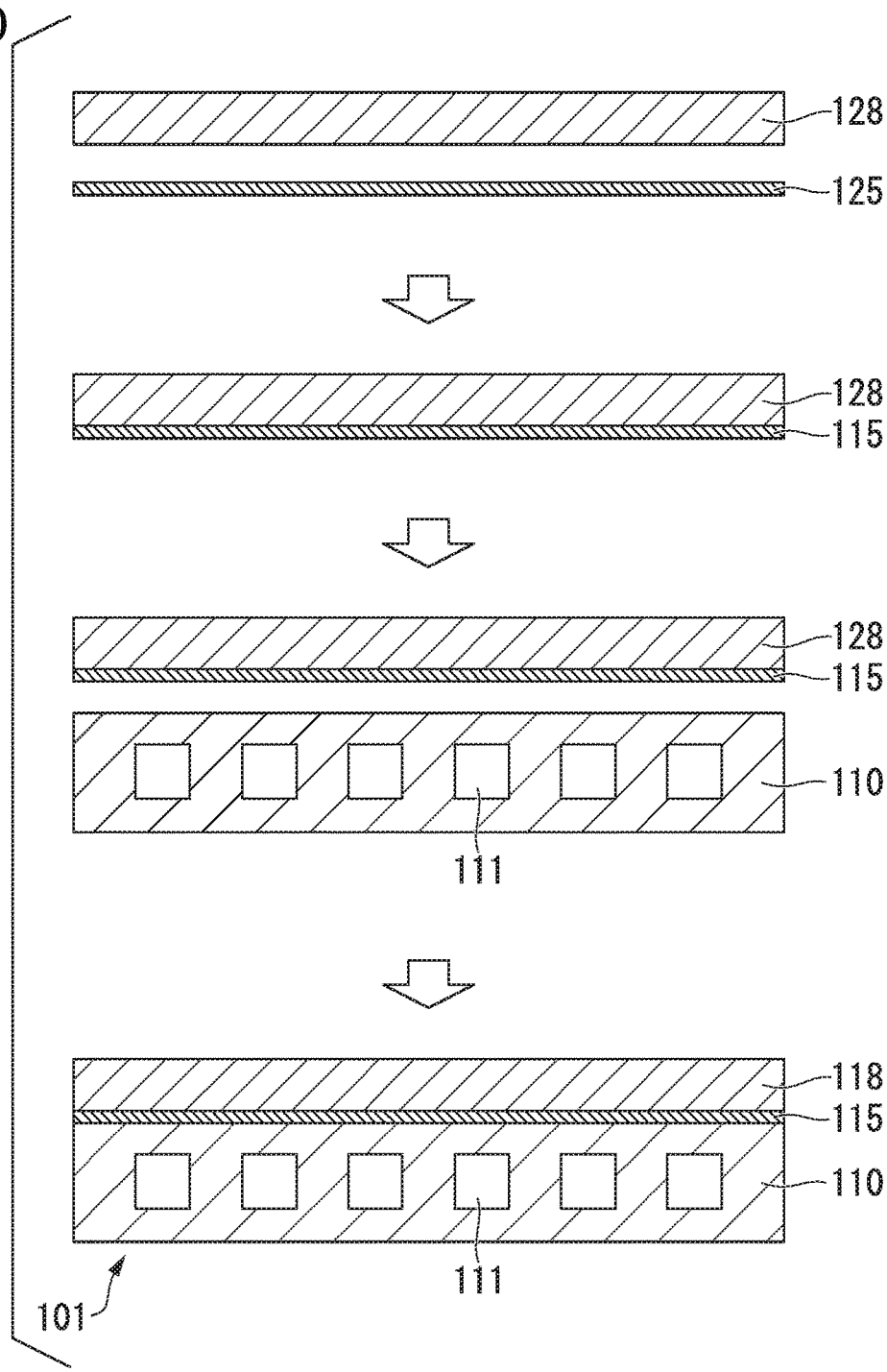
FIG. 10 is a view schematically showing a method of manufacturing the heat sink according to the second embodiment.

The heat sink 101 includes a heat sink main body 110, and a metal member layer 118 that is laminated on one surface (upper side in FIG. 6) of the heat sink main body 110 and is constituted by copper, nickel, or silver. In this embodiment, as shown in FIG. 10, the metal member layer 118 is configured through bonding of a metal plate 128 that is constituted by an oxygen-free copper rolled plate having a thickness of 2 mm. The thickness of the metal plate 128 is preferably 0.001 mm to 3 mm, but there is no limitation to this range.

The heat sink main body 110 is provided with a flow passage 111 through which a cooling medium flows. The heat sink main body 110 is constituted by an aluminum alloy in which a Si concentration is set to be in a range of 1 mass % to 25 mass %. Specifically, the heat sink main body 110 is constituted by ADC3 that is a die-casting aluminum alloy defined in JIS H 2118:2006. ADC3 is an aluminum alloy that contains Si in a range of 9.0 to 11.0 mass %, and Mg in a range of 0.45 to 0.64 mass %. The Si concentration of the aluminum alloy that constitutes the heat sink main body 110 is preferably set in a range of 4 mass % to 13 mass %, but there is no limitation to this range.

Here, a Ti layer 115 is formed at a bonding portion between the heat sink main body 110 and the metal member layer 118.

The metal member layer 118 and the Ti layer 115, and the Ti layer 115 and the heat sink main body 110 are respectively subjected to the solid-phase diffusion bonding.

Figure 7:
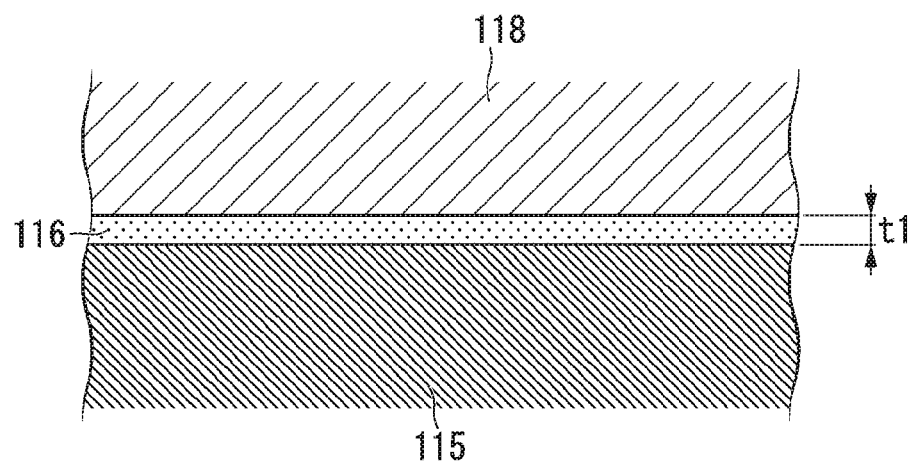
FIG. 7 is an enlarged view showing a bonding interface between a metal member layer and a Ti layer in FIG. 6.

As shown in FIG. 7, a Cu—Ti layer 116 is formed at a bonding interface between the metal member layer 118 and the Ti layer 115. In this embodiment, the thickness t1 of the Cu—Ti layer 116 is set to be in a range of 1 μm≤t1≤8 μm. The thickness t1 of the Cu—Ti layer 116 is preferably set in a range of 2 μm≤t1≤6.5 μm, but there is no limitation to this range.

Figure 8:
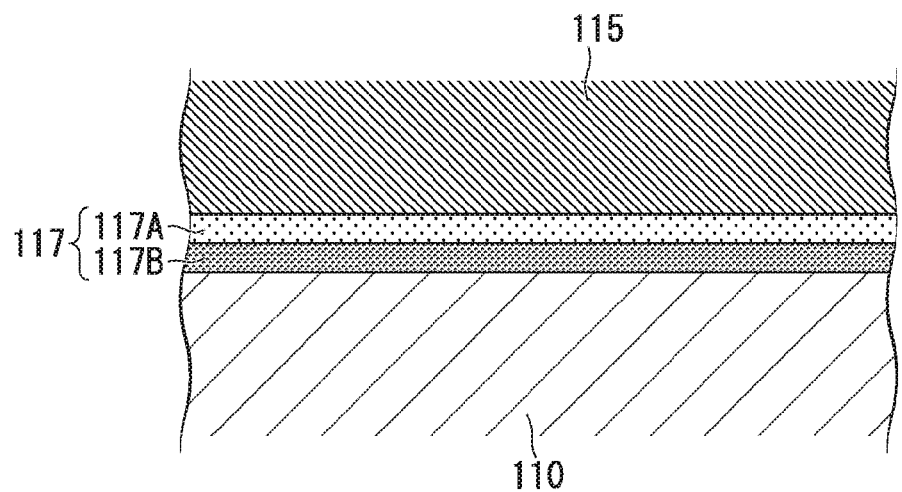
FIG. 8 is an enlarged view showing a bonding interface between a heat sink main body and the Ti layer in FIG. 6.

In this embodiment, as shown in FIG. 8, Al—Ti—Si layer 117 in which Si is solid-soluted in Al$_3$Ti is formed at a bonding interface between the heat sink main body 110 and the Ti layer 115. The Al—Ti—Si layer 117 includes a first Al—Ti—Si layer 117A that is formed on a Ti layer 115 side, and a second Al—Ti—Si layer 117B that is formed on a heat sink main body 110 side.

The first Al—Ti—Si layer 117A and the second Al—Ti—Si layer 117B are composed of an Al—Ti—Si phase in which Si is solid-soluted in Al$_3$Ti, and a Si concentration of the second Al—Ti—Si layer 117B is set to be lower than a Si concentration of the first Al—Ti—Si layer 117A. The Si concentration of the first Al—Ti—Si layer 117A is set to 10 at % to 30 at %, and the Si concentration of the second Al—Ti—Si layer 117B is set to be equal to or greater than 0.6 at % and less than 10 at %. It is preferable that the Si concentration of the first Al—Ti—Si layer 117A is set to 15 at % to 25 at %, and the Si concentration of the second Al—Ti—Si layer 117B is set to 2 at % to 5 at %, but there is no limitation to the ranges.

Figure 9:
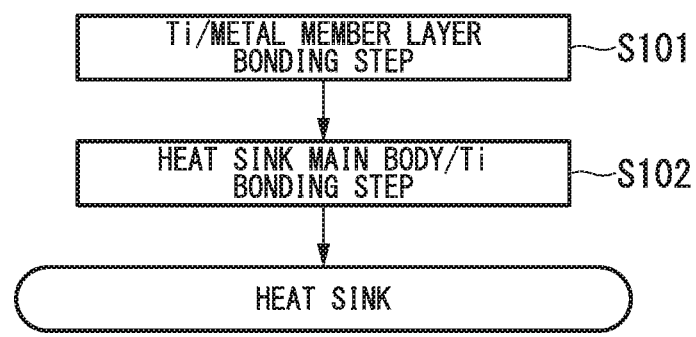
FIG. 9 is a flowchart showing a method of manufacturing the heat sink according to the second embodiment.

Next, description will be given of a method of manufacturing the heat sink 101 according to this embodiment with reference to FIG. 9 and FIG. 10.

(Ti/Metal Member Layer Bonding Step S101)

First, as shown in FIG. 10, a metal plate 128 that becomes the metal member layer 118, and titanium foil 125 that becomes the Ti layer 115 are laminated, and the resultant laminated body is put in a vacuum heating furnace and is heated therein in a pressurized state (pressure is set to 1 to 35 kgf/cm$^2$ (0.10 to 3.43 MPa)) in a laminating direction to subject the metal plate 128 and the titanium foil 125 to the solid-phase diffusion bonding. In respective bonding surfaces, which are subjected to the solid-phase diffusion bonding, of the metal plate 128 and the titanium foil 125, scratches on the bonding surfaces are removed in advance, and thus the bonding surfaces are made to be smooth. In addition, the purity of the titanium foil 125 is set to 99 mass % or greater, and the thickness of the titanium foil 125 is set to 3 μm to 40 μm. In this embodiment, the thickness is set to 10 μm.

Here, it is preferable that a pressure inside the vacuum heating furnace is set to be in a range of $10^{-6}$ Pa to $10^{-3}$ Pa, a heating temperature is set to 600° C. to 670° C., and retention time is set to be in a range of 30 minutes to 180 minutes. It is more preferable that the heating temperature is set to 630° C. to 670° C., and the retention time is set to be in a range of 45 minutes to 120 minutes, but there is no limitation to the ranges.

(Heat Sink Main Body/Ti Bonding Step S102)

Next, the Ti layer 115 and the heat sink main body 110 are laminated, and the resultant laminated body is put in a vacuum heating furnace and is heated therein in a pressurized state (pressure is set to 1 to 35 kgf/cm² (0.10 to 3.43 MPa)) in a laminating direction to subject the Ti layer 115 and the heat sink main body 110 to the solid-phase diffusion bonding. In respective bonding surfaces, which are subjected to the solid-phase diffusion bonding, of the Ti layer 115 and the heat sink main body 110, scratches on the bonding surfaces are removed in advance, and thus the bonding surfaces are made to be smooth.

Here, it is preferable that a pressure inside the vacuum heating furnace is set to be in a range of $10^{-6}$ Pa to $10^{-3}$ Pa, a heating temperature is set to 400° C. to 520° C., and retention time is set to be in a range of 3 hours to 48 hours. Furthermore, it is more preferable that the heating temperature is set to 480° C. to 520° C., and the retention time is set to be in a range of 18 hours to 24 hours, but there is no limitation to the ranges.

In this manner, the heat sink 101 according to this embodiment is manufactured.

According to the heat sink 101 according to this embodiment configured as described above, the metal member layer 118 is formed by bonding the metal plate 128 constituted by an oxygen-free copper rolled plate on one surface of the heat sink main body 110, and thus it is possible to spread heat in a plane direction due to the metal member layer 118, and thus it is possible to greatly improve heat radiation properties. In addition, it is possible to bond another member and the heat sink 101 by using solder and the like in a satisfactory manner.

The heat sink main body 110 is constituted by an aluminum alloy in which the Si concentration is set to be in a range of 1 mass % to 25 mass %. Specifically, the heat sink main body 110 is constituted by ADC3 (Si concentration is 9.0 to 11.0 mass %) that is a die-casting aluminum alloy defined in JIS H 2118:2006. According to this, it is possible to construct the heat sink main body 110 with a complicated structure provided with a flow passage and the like.

The Ti layer 115 is formed at a bonding portion between the heat sink main body 110 and the metal member layer 118, and the metal member layer 118 and the Ti layer 115, and the Ti layer 115 and the heat sink main body 110 are respectively subjected to the solid-phase diffusion bonding. According to this, it is possible to suppress mutual diffusion of Al atoms of the heat sink main body 110 and Cu atoms of the metal member layer 118 due to the Ti layer 115. As a result, it is possible to suppress formation of a hard and brittle intermetallic compound layer in a large thickness due to occurrence of a liquid phase at the bonding portion between the heat sink main body 110 and the metal member layer 118. As a result, it is possible to obtain the heat sink 101 having satisfactory bonding reliability between the heat sink main body 110 and the metal member layer 118.

In this embodiment, after the titanium foil 125 that becomes the Ti layer 115, and the metal plate 128 that becomes the metal member layer 118 are subjected to the solid-phase diffusion bonding in the Ti/metal member layer bonding step S101, the Ti layer 115 and the heat sink main body 110 are subjected to the solid-phase diffusion bonding in the heat sink main body/Ti bonding step S102. According to this, it is possible to set bonding conditions between the titanium foil 125 and the metal plate 128 in a relatively free manner, and thus it is possible to reliably subject the Ti layer 115 and the metal member layer 118 to the solid-phase diffusion bonding. In this embodiment, the Cu—Ti layer 116 of which the thickness t1 is set to be in a range of 1 μm≤t1≤8 μm is formed at the bonding interface between the metal member layer 118 and the Ti layer 115, and thus the metal member layer 118 and the Ti layer 115 are reliably bonded to each other.

In the heat sink main body/Ti bonding step S102, it is possible to reliably subject the Ti layer 115 and the heat sink main body 110 to the solid-phase diffusion bonding under a low-temperature condition in which the heat sink main body 110 is not melted.

In this embodiment, the Al—Ti—Si layer 117 is formed at the bonding portion between the heat sink main body 110 and the Ti layer 115, and the Si concentration of the first Al—Ti—Si layer 117A that is formed on the Ti layer 115 side is higher than the Si concentration of the second Al—Ti—Si layer 117B that is formed on the heat sink main body 110 side. According to this, diffusion of Ti atoms to the heat sink main body 110 side is suppressed due to the first Al—Ti—Si layer 117A in which the Si concentration is high, and thus it is possible to make the thickness of the Al—Ti—Si layer 117 small.

The concentration of Si contained in the second Al—Ti—Si layer 117B that is formed on the heat sink main body 110 side is set to be equal to or greater than 0.6 at % and less than 10 at %. According to this, excessive diffusion of Al atoms to the Ti layer 115 side is suppressed, and thus it is possible to make the thickness of the second Al—Ti—Si layer 117B small. In addition, the concentration of Si contained in the first Al—Ti—Si layer 117A that is formed on the Ti layer 115 side is set to 10 at % to 30 at %. According to this, excessive diffusion of Ti atoms to the heat sink main body 110 side is suppressed, and thus it is possible to make the thickness of the first Al—Ti—Si layer 117A small.

Hereinbefore, the embodiments of the invention have been described. However, the invention is not limited thereto, and appropriate modifications can be made in a range not departing from the technical idea of the invention.

For example, in the embodiments, description has been given of a case where as the metal member layer, the Cu layer constituted by copper is subjected to the bonding. However, a Ni layer constituted by nickel or a nickel alloy, or a Ag layer constituted by silver or a silver alloy may be subjected to the bonding instead of the Cu layer.

In a case where the Ni layer is formed instead of the Cu layer, solderability becomes satisfactory, and thus it is possible to improve bonding reliability with another member. In addition, in a case where the Ni layer is formed through the solid-phase diffusion bonding, a masking process, which is performed when forming the Ni plating film through electroless plating and the like, is not necessary, and thus it is possible to reduce the manufacturing cost. In this case, it is preferable that the thickness of the Ni layer is set to 1 μm to 30 μm. In a case where the thickness of the Ni layer is less than 1 μm, there is a concern that the effect of improving the bonding reliability with another member may disappear. In a case where the thickness is greater than 30 µm, the Ni layer serves as a thermal resistive body, and thus there is a concern that it is difficult to efficiently transfer heat. In addition, in a case of forming the Ni layer through the solid-phase diffusion bonding, the solid-phase diffusion bonding can be performed under the same conditions as in the above-described embodiments. The thickness of the Ni layer is more preferably set to 1 µm to 15 µm, but there is no limitation to this range.

In a case of forming the Ag layer instead of the Cu layer, for example, silver oxide paste, which contains silver oxide particles and a reducing agent composed of an organic, is used during bonding with another member, and bonding between silver reduced from silver oxide and the Ag layer is bonding between the same kinds of metals. Accordingly, it is possible to improve bonding reliability. In addition, an Ag layer having satisfactory thermal conductivity is formed, and thus heat is spread in a plane direction, and heat transfer can be efficiently performed. In this case, it is preferable that the thickness of the Ag layer is set to 1 µm to 20 µm.

In a case where the thickness of the Ag layer is less than 1 µm, there is a concern that an effect of improving the bonding reliability with another member is not obtained. In addition, in a case where the thickness is greater than 20 µm, the effect of improving the bonding reliability is not obtained, and thus an increase in the cost is caused. In addition, in a case of forming the Ag layer through the solid-phase diffusion bonding, the solid-phase diffusion bonding may be performed under the same conditions as in the above-described embodiments. It is preferable that the thickness of the Ag layer is set to 1 µm to 10 µm, but there is no limitation to this range.

Figure 11:
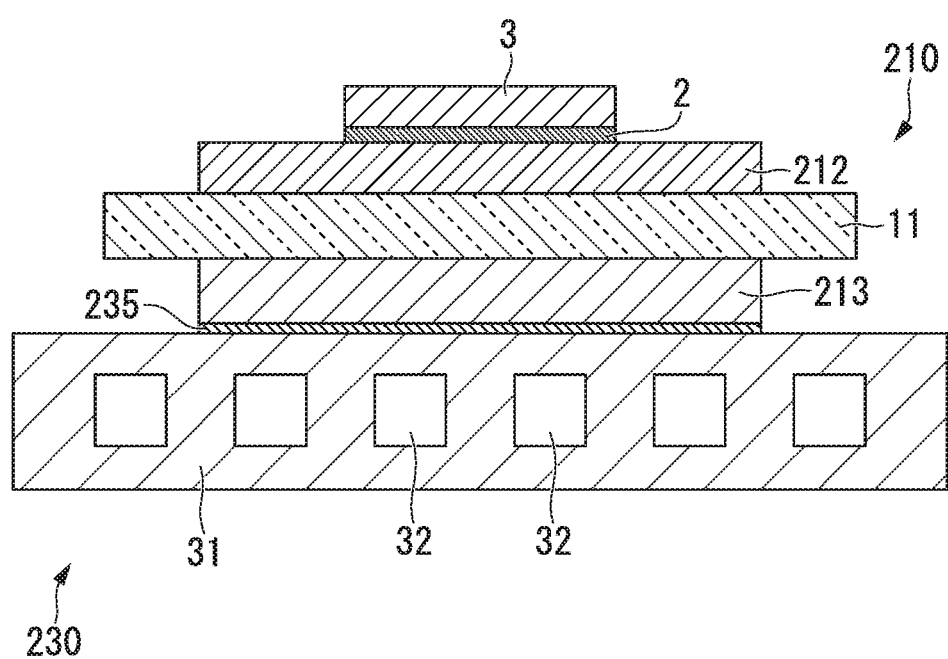
FIG. 11 is a view schematically showing a power module including a power module substrate with heat sink according another embodiment of the invention.

In the first embodiment, description has been given of a configuration in which the metal layer 13 includes Al layer 13A and the Cu layer 13B. However, there is no limitation to this configuration, and the entirety of the metal layer may be constituted by copper or a copper alloy as shown in FIG. 11. In a power module substrate with heat sink 230 shown in FIG. 11, a copper plate is bonded to the other surface (a lower side in FIG. 11) of the ceramic substrate 11 by a DBC method, an active metal brazing method, and the like, and thus a metal layer 213 constituted by copper or a copper alloy is formed. In addition, the metal layer 213 and a Ti layer 235, and the Ti layer 235 and the heat sink 31 are respectively subjected to the solid-phase diffusion bonding. Furthermore, in a power module substrate 210 shown in FIG. 11, a circuit layer 212 is also constituted by copper or a copper alloy.

In the first embodiment, description has been given of a configuration in which the circuit layer is formed through bonding of the aluminum plate having the purity of 99 mass %. However, there is no limitation to the configuration, and the circuit layer may be constituted by other metals such as different aluminum or aluminum alloy, copper, and a copper alloy.

The circuit layer may be set to have a two-layer structure of an Al layer and a Cu layer. This is also true of a power module substrate shown in FIG. 11.

In the first embodiment, the circuit layer and Al layer forming step S02, the Cu layer (metal layer) forming step S03, and the Ti/metal layer bonding step S04 are separately performed. However, there is no limitation thereto, and the steps may be collectively performed. That is, the power module substrate 10 can be manufactured as follows. The aluminum plate 22 is laminated on one surface of the ceramic substrate through the Al—Si-based brazing material foil 26. The Al—Si-based brazing material foil 26, the aluminum plate 23A, the first titanium foil 25, the copper plate 23B, and the second titanium foil 45 are laminated on the other surface in this order from a ceramic substrate side. The resultant laminated body is heated (600° C. to 643° C.) for retention time of 30 minutes to 180 minutes in a pressurized state (pressure is set to 1 to 35 kgf/cm² (0.10 to 3.43 MPa)) in a laminating direction.

EXAMPLES

Hereinafter, description will be given of results of a supporting experiment that was performed to confirm the effect of the invention.

Example 1

An aluminum plate (50 mm×50 mm×10 mm (thickness)) and a metal plate (40 mm×40 mm), which are shown in Table 1, were prepared. In addition, titanium foil having the purity of 99 mass % and the thickness of 10 µm was prepared.

In Examples 1 to 8, the metal plate and the titanium foil in Table 1 were subjected to the solid-phase diffusion bonding under conditions shown in Table 1. Then, the metal plate to which the titanium foil was bonded, and the aluminum plate were subjected to the solid-phase diffusion bonding under conditions shown in Table 1.

In Comparative Examples 1 and 2, bonding of the metal plate, the titanium foil, and the aluminum plate was simultaneously performed. In addition, in Example 1, a plate of Al-1.3 mass % Si was used as the aluminum plate. A Si concentration of the aluminum plate was obtained by ICP emission spectrometry (SPS3100, emission spectrum analyzer manufactured by SII Nano Technology Inc.) after acid dissolution of the aluminum plate.

In a bonded body manufactured as described above, a cross-section of a bonding portion between the metal plate and the Ti layer was observed to measure the thickness of an intermetallic compound layer of a metal element that constitutes the metal plate and Ti. In addition, a bonding rate of the bonding portion between the aluminum plate and the metal plate was measured. A specific sequence of evaluation is described below.

(Observation of Cross-Section and Measurement of Thickness of Intermetallic Compound Layer of Metal Element that Constitutes Metal Plate and Ti)

The cross-section of the bonded body was ion-etched by using a cross-section polisher (SM-09010, manufactured by JEOL Ltd.) under conditions of an ion acceleration voltage: 5 kV, processing time: 14 hours, and the amount of protrusion from a shielding plate: 100 µm. Next, the bonding portion between the metal plate and the Ti layer was observed with EPMA (JXA-8530F, manufactured by JEOL Ltd.) at five visual fields, each being set to a magnification of 2000 times (45 µm (vertical); 60 µm (horizontal)), and mapping of Ti was performed. An area of the intermetallic compound layer was obtained, and the area was divided by dimensions of a width of the measurement visual field to calculate a thickness, and an average of the thickness of the five visual fields was set to the thickness of the intermetallic compound layer.

In a case of using a metal plate constituted by copper, a region in which a Ti concentration was 19 at % to 67 at % was set to the intermetallic compound layer.

In a case of using a metal plate constituted by nickel, a region in which the Ti concentration was 25 at % to 67 at % was set to the intermetallic compound layer.

In a case of using a metal plate constituted by silver, a region in which the Ti concentration was 50 at % to 67 at % was set to the intermetallic compound layer.

(Evaluation of Bonding Rate)

The bonding rate of the bonding portion between the aluminum plate and the metal plate of the bonded body was evaluated by using an ultrasonic test device (FineSAT200, manufactured by Hitachi Power Solutions Co., Ltd.), and was calculated by the following Expression. Here, an initial bonding area is an area to be bonded before bonding, and was set as an area of the aluminum plate (50 mm×50 mm). Peeling-off is shown as a white portion in an image obtained through binarization of an ultrasonic test image, and thus an area of the white portion was set as a peeling-off area.

Bonding Rate (%)={(initial bonding area)−(peeling-off area)}/(initial bonding area×100

Results of the above-described evaluation are shown in Table 1.

plate and the Ti layer could be reliably subjected to the solid-phase diffusion bonding under a low-temperature condition at which the aluminum plate was not melted.

Example 2

An aluminum plate (50 mm×50 mm×5 mm (thickness)) and a metal plate (40 mm×40 mm), which are shown in Table 2, were prepared. In addition, titanium foil having the purity of 99 mass % and the thickness of 10 μm was prepared. Furthermore, in Example 11 and Example 12, a plate of Al-1.3 mass % Si was used as the aluminum plate. The Si concentration was obtained by the same method as in Example 1.

In Examples 11 to 17, the metal plate and the titanium foil in Table 2 were subjected to the solid-phase diffusion bonding under conditions shown in Table 2. Then, the metal plate to which the titanium foil was bonded, and the alumi-

TABLE 1

| | Aluminum plate | | Metal plate | | Metal plate/Ti bonding | | Ti/aluminum plate bonding | | Observation of cross-section * | |
|---|---|---|---|---|---|---|---|---|---|---|
| | Material | Si concentration (mass %) | Material | Thickness (μm) | Temperature (° C.) | Time (minute) | Temperature (° C.) | Time (hour) | Thickness of intermetallic compound (μm) | Bonding rate (%) |
| Example 1 | — | 1.3 | Oxygen-free copper | 3000 | 650 | 90 | 500 | 20 | 4 | 94.3 |
| Example 2 | AC2A | 5.6 | Oxygen-free copper | 3000 | 650 | 120 | 450 | 15 | 5 | 97.0 |
| Example 3 | AC4B | 8.1 | Oxygen-free copper | 3000 | 650 | 120 | 450 | 15 | 5 | 95.0 |
| Example 4 | ADC10 | 8.5 | Oxygen-free copper | 3000 | 650 | 60 | 500 | 10 | 3 | 98.5 |
| Example 5 | ADC12 | 11.4 | Oxygen-free copper | 3000 | 650 | 150 | 500 | 9 | 5 | 95.8 |
| Example 6 | ADC12 | 11.4 | Nickel | 20 | 650 | 150 | 500 | 9 | 5 | 97.7 |
| Example 7 | ADC12 | 11.4 | Silver | 10 | 650 | 150 | 500 | 9 | 5 | 95.4 |
| Example 8 | AC9A | 23.9 | Oxygen-free copper | 3000 | 650 | 90 | 500 | 5 | 4 | 95.1 |
| Comparative Example 1 | ADC12 | 11.4 | Oxygen-free copper | 3000 | 450 | 900 | 450 | 15 | 0 | 0.0 |
| Comparative Example 2 | ADC12 | 11.4 | Oxygen-free copper | 3000 | 650 | 150 | 650 | 9 | — | 59.1 |

* Observation of a cross-section: observation of a cross-section of a bonding interface between a metal plate and a Ti layer/evaluation of the thickness of an intermetallic compound of a metal element that constitutes the metal plate and Ti In Comparative Example 1, bonding of the metal plate, the titanium foil, and the aluminum plate was simultaneously performed, and a bonding temperature was set to a low temperature. In Comparative Example 1, the metal plate and the titanium foil (Ti layer) were not sufficiently bonded.

In Comparative Example 2, bonding of the metal plate, the titanium foil, and the aluminum plate was simultaneously performed, and the bonding temperature was set to a high temperature. In Comparative Example 2, a part of the aluminum plate was melted, and thus the bonding rate greatly decreased. Furthermore, in Comparative Example 2, a part of the aluminum plate was melted, and thus it was difficult to measure the layer thickness of the intermetallic compound.

In contrast, in Examples 1 to 8, after bonding the metal plate and the titanium foil (Ti layer), the Ti layer and the aluminum plate were bonded. In Examples 1 to 8, the metal plate and the titanium foil (Ti layer) could be subjected to the solid-phase diffusion bonding under a relatively high temperature condition, and thus it was possible to reliably bond the metal plate and the Ti layer. In addition, the aluminum num plate were subjected to the solid-phase diffusion bonding under conditions shown in Table 2.

In a bonded body manufactured as described above, a cross-section of a bonding portion between the metal plate and the Ti layer was observed to measure the thickness of an intermetallic compound layer of a metal element that constitutes the metal plate and Ti. The thickness measuring method was set to the same as in Example 1.

The Si concentration of the first Al—Ti—Si layer and the second Al—Ti—Si layer was obtained as follows.

The bonded body was mechanically cut out in the laminating direction. A cross-section that was obtained was mechanically polished by a thickness of approximately 30 μm, and was set as a cross-section sample. Then, argon ions set to 4 kV were incident to the vicinity of the bonding interface from upper and lower sides (the laminating direction and surfaces perpendicular) at an angle of 4°, and the cross-section sample was made to be thin with sputtering until a hole was formed in the cross-section sample. An edge of the hole became an edge shape, and the thickness thereof was approximately 0.1 μm through which electron beams could be transmitted. Accordingly, this portion was measured with TEM and EDS. Measurement with TEM and EDS was performed using Titan ChemiSTEM (attached with EDS detector) manufactured by FEI Company under conditions of an acceleration voltage of 200 kV, a beam diameter of 5 nm, and a magnification of 10000 times.

In the measurement with TEM and EDS, line analysis of Si was performed from the Ti layer side toward the aluminum plate side (aluminum member side), and a peak of Si, which appeared for the first time, was set as the Si concentration of the first Al—Ti—Si layer, and a site spaced away from the peak to the aluminum plate side by 150 nm was set as the Si concentration of the second Al—Ti—Si layer.

A bonding rate of the bonding portion between the aluminum plate and the metal plate after a thermal cycling test was measured. In the thermal cycling test, a thermal shock tester TSB-51 (manufactured by ESPEC CORP.) was used, and a cycle for five minutes at −40° C. and for five minutes at 150° C. was repeated 4000 cycles in a liquid phase (fluorine-based inert liquid (Fluorinert, manufactured by 3M)) with respect to each bonded body. The method of measuring the bonding rate was set to be the same as in Example 1.

were high, and thus a bonded body excellent in the bonding reliability was obtained.

On the other hand, in Example 11 in which the Si concentration of the second Al—Ti—Si layer was 0.2 at %, the initial bonding rate slightly decreased in comparison to Examples 12 to 14.

In Example 17 in which the Si concentration of the second Al—Ti—Si layer was 13.1 at %, the Si concentration was high, and thus the bonding interface became hard, and the bonding reliability slightly decreased.

INDUSTRIAL APPLICABILITY

According to the bonded body, the power module substrate with heat sink, the heat sink, and the method of manufacturing the same of the invention, it is possible to bond an aluminum member constituted by an aluminum alloy, and a metal member constituted by copper, nickel, or silver in a satisfactory manner. According to this, the bonded body, the power module substrate with heat sink, and the heat sink of the invention are suitable for a large-power

TABLE 2

| | Aluminum plate | | Metal plate | | Metal plate/Ti bonding | | Ti/aluminum plate bonding | |
|---|---|---|---|---|---|---|---|---|
| | Material | Si concentration (mass %) | Material | Thickness (μm) | Temperature (° C.) | Time (minute) | Temperature (° C.) | Time (hour) |
| Example 11 | — | 1.3 | Oxygen-free copper | 3000 | 650 | 120 | 450 | 1 |
| Example 12 | — | 1.3 | Oxygen-free copper | 3000 | 650 | 120 | 450 | 5 |
| Example 13 | ADC10 | 8.5 | Oxygen-free copper | 3000 | 650 | 120 | 520 | 15 |
| Example 14 | ADC10 | 8.5 | Oxygen-free copper | 3000 | 650 | 120 | 500 | 20 |
| Example 15 | ADC12 | 11.4 | Oxygen-free copper | 3000 | 650 | 120 | 500 | 18 |
| Example 16 | ADC12 | 11.4 | Oxygen-free copper | 3000 | 650 | 120 | 510 | 24 |
| Example 17 | AC9A | 23.9 | Oxygen-free copper | 3000 | 650 | 120 | 520 | 70 |

TABLE 3

| | Observation of cross-section* Thickness of intermetallic compound (μm) | Si concentration (at %) | | Bonding rate | |
|---|---|---|---|---|---|
| | | First Al—Ti—Si layer | Second Al—Ti—Si layer | Initial (%) | After cycle (%) |
| Example 11 | 5 | 7.9 | 0.2 | 77.1 | 50.3 |
| Example 12 | 5 | 10.3 | 0.6 | 93.2 | 91.8 |
| Example 13 | 5 | 15.2 | 2.2 | 98.0 | 94.7 |
| Example 14 | 5 | 16.5 | 4.4 | 97.4 | 94.5 |
| Example 15 | 5 | 17.3 | 4.9 | 97.0 | 95.0 |
| Example 16 | 5 | 18.7 | 9.8 | 96.7 | 92.8 |
| Example 17 | 5 | 24.7 | 13.1 | 97.7 | 82.4 |

*Observation of a cross-section: observation of a cross-section of a bonding interface between a metal plate and a Ti layer/evaluation of the thickness of an intermetallic compound of a metal element that constitutes the metal plate and Ti In Examples 12 to 14 in which the Si concentration of the second Al—Ti—Si layer was 0.6 at % to 9.8 at %, an initial bonding rate, and a bonding rate after the thermal cycling control power semiconductor element that is used to control wind power generation, an electric vehicle, a hybrid vehicle, and the like.

REFERENCE SIGNS LIST 10, 210: Power module substrate
11: Ceramic substrate
13, 213: Metal layer
13B: Cu layer (metal member)
31: Heat sink (aluminum member)
35: Second Ti layer (Ti layer)
45: Second titanium foil (Ti material)
101: Heat sink
110: Heat sink main body
115: Ti layer
118: Metal member layer

The invention claimed is:

1. A bonded body in which an aluminum member constituted by an aluminum alloy, and a metal member constituted by copper, nickel, or silver are bonded to each other,
   wherein the aluminum alloy comprises 8.1 mass % to 23.9 mass % of Si and a balance of Al,
   a Ti layer is formed at a bonding portion between the aluminum member and the metal member, and the aluminum member and the Ti layer, and the Ti layer and the metal member are respectively subjected to solid-phase diffusion bonding,
   an Al-Ti-Si layer is formed at a bonding interface between the aluminum member and the Ti layer,
   the Al-Ti-Si layer includes a first Al-Ti-Si layer that is formed on a Ti layer side, and a second Al-Ti-Si layer that is formed on an aluminum member side,
   the Si concentration of the first Al-Ti-Si layer is 10 at % to 30 at %,
   the Si concentration of the second Al-Ti-Si layer is equal to or greater than 0.6 at % and less than 10 at %, and
   a total layer thickness of the first Al-Ti-Si layer and the second Al-Ti-Si layer is 5 µm or less.

2. A method of manufacturing the bonded body according to claim 1, the method comprising:
   a Ti/metal member bonding step of subjecting a Ti material that becomes the Ti layer and the metal member to solid-phase diffusion bonding; and
   an aluminum member/Ti bonding step of subjecting the metal member to which the Ti material is bonded, and the aluminum member to solid-phase diffusion bonding.

3. The method of manufacturing the bonded body according to claim 2,
   wherein the Ti material and the metal member is placed in a vacuum heating furnace and is heated in a pressurized state in which a pressure is 1 to 35 kgf/cm$^2$ in the laminating direction in the Ti/metal member bonding step.

4. The method of manufacturing the bonded body according to claim 3,
   wherein a pressure inside the vacuum heating furnace is $10^{-6}$ Pa to $10^{-3}$ Pa, a heating temperature is 600° C. to 643° C., and retention time is 30 minutes to 180 minutes in the Ti/metal member bonding step.

5. The method of manufacturing the bonded body according to claim 2,
   wherein the metal member to which the Ti material is bonded, and the aluminum member is placed in a vacuum heating furnace and is heated in a pressurized state in which a pressure is 1 to 35 kgf/cm$^2$ in the laminating direction in the aluminum member/Ti bonding step.

6. The method of manufacturing the bonded body according to claim 5,
   wherein a pressure inside the vacuum heating furnace is $10^{-6}$ Pa to $10^{-3}$ Pa, a heating temperature is 400° C. to 520° C., and retention time is 18 hours to 24 hours in the aluminum member/Ti member bonding step.

7. A power module substrate with heat sink, comprising:
   an insulating layer;
   a circuit layer that is formed on one surface of the insulating layer;
   a metal layer that is formed on the other surface of the insulating layer; and
   a heat sink that is bonded to the metal layer,
   wherein in the metal layer, a bonding surface with the heat sink is constituted by copper, nickel, or silver,
   the heat sink is constituted by an aluminum alloy,
   the aluminum alloy comprises 8.1 mass % to 23.9 mass % of Si and a balance of Al,
   a Ti layer is formed at a bonding portion between the metal layer and the heat sink, and the metal layer and the Ti layer, and the Ti layer and the heat sink are respectively subjected to solid-phase diffusion bonding,
   an Al-Ti-Si layer is formed at a bonding interface between an aluminum member and the Ti layer,
   the Al-Ti-Si layer includes a first Al-Ti-Si layer that is formed on a Ti layer side, and a second Al-Ti-Si layer that is formed on an aluminum member side,
   the Si concentration of the first Al-Ti-Si layer is 10 at % to 30 at %,
   the Si concentration of the second Al-Ti-Si layer is equal to or greater than 0.6 at % and less than 10 at %, and
   a total layer thickness of the first Al-Ti-Si layer and the second Al-Ti-Si layer is 5 µm or less.

8. A method of manufacturing the power module substrate with heat sink according to claim 7, the method comprising:
   a Ti/metal layer bonding step of subjecting a Ti material that becomes the Ti layer and the metal layer to solid-phase diffusion bonding; and
   a heat sink/Ti bonding step of subjecting the metal layer to which the Ti material is bonded, and the heat sink to solid-phase diffusion bonding.

9. A heat sink, comprising:
   a heat sink main body; and
   a metal member layer that is bonded to the heat sink main body,
   wherein the metal member layer is constituted by copper, nickel, or silver,
   the heat sink main body is constituted by an aluminum alloy,
   the aluminum alloy comprises 8.1 mass % to 23.9 mass % of Si and a balance of Al,
   a Ti layer is formed at a bonding portion between the heat sink main body and the metal member layer, and the heat sink main body and the Ti layer, and the Ti layer and the metal member layer are respectively subjected to solid-phase diffusion bonding,
   an Al-Ti-Si layer is formed at a bonding interface between an aluminum member and the Ti layer,
   the Al-Ti-Si layer includes a first Al-Ti-Si layer that is formed on a Ti layer side, and a second Al-Ti-Si layer that is formed on an aluminum member side,
   the Si concentration of the first Al-Ti-Si layer is 10 at % to 30 at %,
   the Si concentration of the second Al-Ti-Si layer is equal to or greater than 0.6 at % and less than 10 at %, and
   a total layer thickness of the first Al-Ti-Si layer and the second Al-Ti-Si layer is 5 µm or less.

10. A method of manufacturing the heat sink according to claim 9, the method comprising:
- a Ti/metal member layer bonding step of subjecting a Ti material that becomes the Ti layer and the metal member layer to solid-phase diffusion bonding; and
- a heat sink main body/Ti bonding step of subjecting the metal member layer to which the Ti material is bonded, and the heat sink main body to solid-phase diffusion bonding.

* * * * *